United States Patent
Gale et al.

(10) Patent No.: US 9,758,044 B2
(45) Date of Patent: Sep. 12, 2017

(54) BUS LEAKAGE RESISTANCE ESTIMATION FOR ELECTRICAL ISOLATION TESTING AND DIAGNOSTICS

(71) Applicant: FORD GLOBAL TECHNOLOGIES, LLC, Dearborn, MI (US)

(72) Inventors: Allan R. Gale, Livonia, MI (US); Richard W. Kautz, North Branch, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 284 days.

(21) Appl. No.: 14/504,588

(22) Filed: Oct. 2, 2014

(65) Prior Publication Data

US 2016/0096433 A1 Apr. 7, 2016

(51) Int. Cl.
*G01R 31/02* (2006.01)
*B60L 3/00* (2006.01)
(Continued)

(52) U.S. Cl.
CPC .......... *B60L 3/0069* (2013.01); *G01R 27/025* (2013.01); *G01R 31/007* (2013.01);
(Continued)

(58) Field of Classification Search
CPC .... G01R 31/025; G01R 27/18; G01R 31/007; G01R 31/1227; G01R 31/34;
(Continued)

(56) References Cited

U.S. PATENT DOCUMENTS 7,626,396 B2  12/2009  Lindsey et al.
7,714,587 B2   5/2010  Lindsey et al.
(Continued)

FOREIGN PATENT DOCUMENTS

JP   2013214475      10/2013
WO   2010029353 A1   3/2010

OTHER PUBLICATIONS

Aravind Mathsyaraja, Ground Fault Detection for Flexible High Voltage Power Systems, A Thesis, Michigan State University, Master of Science, Electrical Engineering, 2010.

*Primary Examiner* — Vincent Q Nguyen
(74) *Attorney, Agent, or Firm* — David B. Kelley; MacMillan, Sobanski & Todd, LLC (57) ABSTRACT

Electrical bus isolation is detected for an electrified vehicle having a DC power source connected to positive and negative buses. The positive bus is connected to chassis ground, and a resulting first current is sensed that flows through a negative bus leakage resistance and a balanced leakage resistance. The negative bus is connected to chassis ground, and a resulting second current is sensed that flows through a negative bus leakage resistance and a balanced leakage resistance. The positive and negative bus leakage resistances are estimated in response to respective ratios of the first and second currents. An isolation value is compared to a threshold, wherein the isolation value is responsive to a voltage of the DC power source and a smaller one of the positive and negative bus leakage resistances. An atypical isolation is signaled when the isolation value is less than the threshold.

15 Claims, 4 Drawing Sheets

(51) Int. Cl.
*G01R 27/02* (2006.01)
*G01R 31/00* (2006.01)

(52) U.S. Cl.
CPC ......... *G01R 31/025* (2013.01); *Y02T 10/7022* (2013.01); *Y02T 10/7241* (2013.01)

(58) Field of Classification Search
CPC .. G01R 31/362; B60L 3/0069; B60L 11/1864; B60L 2200/26; B60L 3/0023; B60L 3/0046; H01M 8/04559
USPC ........................................ 324/503, 509, 522
See application file for complete search history.

(56) References Cited

U.S. PATENT DOCUMENTS

| | | | |
|---|---|---|---|
| 8,207,741 B2 | 6/2012 | Kang et al. | |
| 8,222,907 B2 | 7/2012 | Streit | |
| 2005/0231153 A1* | 10/2005 | Dewey | H01M 8/04955 320/101 |
| 2011/0049977 A1 | 3/2011 | Onnerud et al. | |
| 2011/0304339 A1* | 12/2011 | Schumacher | G01R 31/025 324/509 |
| 2012/0221269 A1* | 8/2012 | Wanner | G01R 27/18 702/65 |
| 2013/0151175 A1 | 6/2013 | Streit | |
| 2013/0245869 A1 | 9/2013 | Nishida et al. | |
| 2014/0253139 A1* | 9/2014 | Lindsey | E01C 19/22 324/510 |
| 2015/0362543 A1 | 12/2015 | Gale et al. | |

* cited by examiner

BUS LEAKAGE RESISTANCE ESTIMATION FOR ELECTRICAL ISOLATION TESTING AND DIAGNOSTICS

CROSS REFERENCE TO RELATED APPLICATIONS

Not Applicable.

STATEMENT REGARDING FEDERALLY SPONSORED RESEARCH

Not Applicable.

BACKGROUND OF THE INVENTION

The present invention relates in general to electrified vehicles using a high voltage bus, and, more specifically, to accurate estimation of the effective isolation resistance present between each high-power bus and a chassis ground.

Electrified vehicles such as for electric vehicles and hybrid electric vehicles typically utilize a high voltage power bus driven by a DC power source which may include storage and/or conversion devices such as a multi-cell battery pack or a fuel cell. The presence of high-voltage buses creates a need for monitoring of the electrical isolation of each bus with respect to the electrically conductive components of the vehicle chassis (ground).

Any leakage resistance present between a DC bus and chassis ground must be sufficiently large. In typical leakage resistance detection systems, there is an assumption that leakage resistance will be between one of the positive or negative DC buses and chassis ground. A typical leakage detector circuit operates by periodically connecting one bus at a time to chassis ground through a current-limiting resistance, and using the resulting current flow to calculate the leakage resistance between the opposite bus and ground. The battery voltage divided by the calculated leakage resistance characterizes the electrical isolation.

The invention is based, in part, on a determination that conventional leakage resistance detection systems based on supplying a current from one bus through a known resistance to the leakage resistance between the ground and the other bus may ignore a potential balanced component of leakage resistance from both buses to ground that can sometimes result in the mischaracterization of the electrical isolation because of a potential discrepancy in the derived leakage resistance values. More specifically, a resistance may exist between the positive bus and chassis ground as well as a resistance of equal value between the negative bus and chassis ground. These resistances, both being equal in value, are hereafter referred to as symmetrical or balanced leakage resistance. A resistance on one bus to chassis without a matching value on the other bus to chassis is hereafter referred to as non-symmetrical or unbalanced leakage resistance. The additional current flow through the balanced leakage resistance may cause the prior art detection system to overestimate the composite balanced and unbalanced resistance which exists between one bus and chassis ground. Estimating this latter composite resistance is desirable in order to more accurately determine the isolation.

One typical source of a balanced leakage resistance would be a hydrogen fuel cell vehicle, wherein a deionizer intended to remove ions from water being used as a coolant fails to maintain proper deionization. As ions build up, the conductance of the cooling water increases and the electrical isolation between both positive and negative fuel cell electrodes and ground is reduced. Another possible source of a balanced leakage resistance includes a symmetrical breakdown in cable insulation.

SUMMARY OF THE INVENTION

The invention recognizes the presence of both balanced and unbalanced leakage resistance that exist between the positive and negative power buses and chassis ground. By differentiating between the leakage resistances that are the same for the two buses versus leakage resistance that is not the same, the invention more accurately determines the electrical isolation. Moreover, by separately identifying the balanced and unbalanced leakage resistances, detection and/or prediction of electrical or other vehicle conditions are enabled.

In one aspect of the invention, an electrified vehicle comprises a positive bus connectable to a positive output of a DC power source and a negative bus connectable to a negative output of the DC power source. A chassis ground is distributed within the vehicle. A first detector circuit is selectably activated to i) connect a first fixed resistance between the positive bus and chassis ground and ii) sense a resulting first current. A second detector circuit is selectably activated to i) connect a second fixed resistance between the negative bus and chassis ground and ii) sense a resulting second current. A control circuit identifies the positive and negative bus leakage resistances in response to a nonlinear function (e.g., ratio) of both the first and second currents. In one preferred embodiment, the current ratios provide a correction factor that can be applied to conventionally derived resistance values.

DETAILED DESCRIPTION OF PREFERRED EMBODIMENTS

The term "electrified vehicle" as used herein includes vehicles having an electric motor for vehicle propulsion, such as battery electric vehicles (BEV), hybrid electric vehicles (HEV), and plug-in hybrid electric vehicles (PHEV). A BEV includes an electric motor, wherein the energy source for the motor is a battery that is re-chargeable from an external electric grid. In a BEV, the battery or other DC source supplies energy for vehicle propulsion. A HEV includes an internal combustion engine and an electric motor, wherein the energy source for the engine is fuel and the energy source for the motor is a DC storage unit such as a battery. In a HEV, the engine is the main source of energy for vehicle propulsion with the battery providing supplemental energy for vehicle propulsion (e.g., the battery buffers fuel energy and recovers kinematic energy in electric form). A PHEV is like a HEV, but the PHEV may have a larger capacity battery that is rechargeable from the external electric grid. In a PHEV, the battery may be the main source of energy for vehicle propulsion until the battery depletes to a low energy level, at which time the PHEV operates like a HEV for vehicle propulsion.

Figure 1:
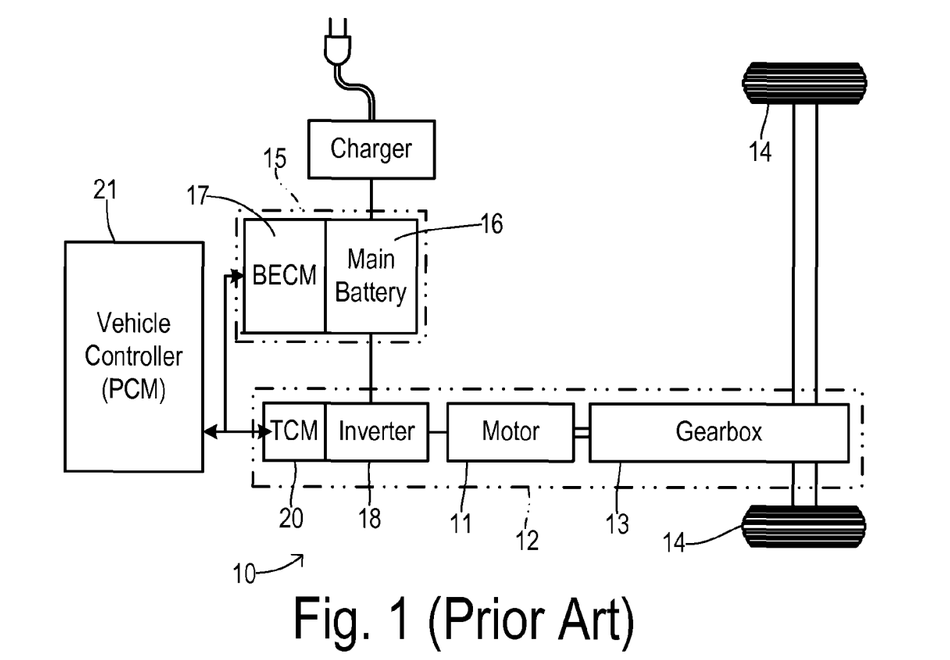
FIG. 1 is a block diagram showing one type of electrified vehicle to which the present invention is applied.

By way of example, FIG. 1 depicts a vehicle 10 as a battery electric vehicle (BEV) propelled by an electric motor 11 without assistance from an internal combustion engine. Motor 11 receives electrical power and provides drive torque for vehicle propulsion. Motor 11 also functions as a generator for converting mechanical power into electrical power through regenerative braking. Motor 11 is part of a powertrain 12 in which a gearbox 13 couples motor 11 to driven wheels 14. Gearbox 13 adjusts the drive torque and speed of motor 11 by a predetermined gear ratio.

Vehicle 10 includes a battery system 15 including a main battery pack 16 and a battery energy controller module (BECM) 17. An output of battery pack 16 is connected to an inverter 18 which converts the direct current (DC) power supplied by the battery to alternating current (AC) power for operating motor 11 in accordance with commands from a traction control module (TCM) 20. TCM 20 monitors, among other things, the position, speed, and power consumption of motor 11 and provides output signals corresponding to this information to other vehicle systems including a main vehicle controller 21 (which may be a powertrain control module, or PCM, for example).

Figure 2:
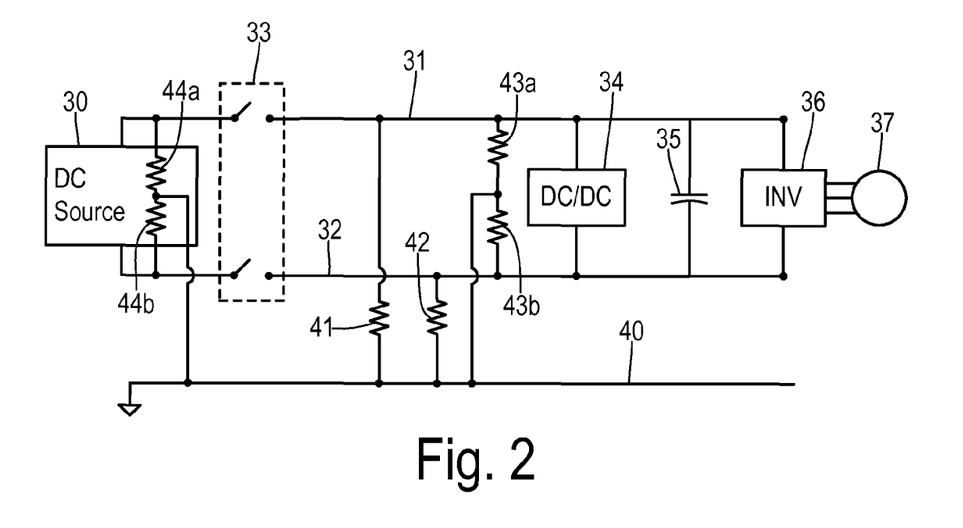
FIG. 2 is a schematic diagram showing one typical bus structure with leakage resistances shown.

FIG. 2 shows a typical bus architecture wherein a DC power source 30 is selectively coupled to a positive bus 31 and a negative bus 32 via contactor switches 33. Buses 31 and 32 may be further coupled to a DC-to-DC converter 34, a link capacitor 35, and an inverter 36 which drives a traction motor 37. A chassis ground 40 represents conductive parts of the vehicle whose electrical potential is taken as a reference and which are conductively linked together.

Electrical isolation of buses 31 and 32 is determined by the electrical leakage resistance between each bus and chassis 40. A leakage resistance 41 represents the level of isolation between positive bus 31 and chassis 40. Leakage resistance 42 represents the isolation between negative bus 32 and chassis 40. Leakage resistances 41 and 42 are the unbalanced or nonsymmetrical leakage resistances. While resistances 41 or 42 may occur only one can be present for the unbalanced resistance. In addition, a balanced leakage resistance, 43a and 43b having the same resistance, may be present between buses 31 and 32 having a junction between them connected to chassis 20. In addition, a balanced resistance may be introduced across buses 31 and 32 within DC source 30, shown as leakage resistances 44a and 44b having their junction coupled to chassis 40.

Figure 3:
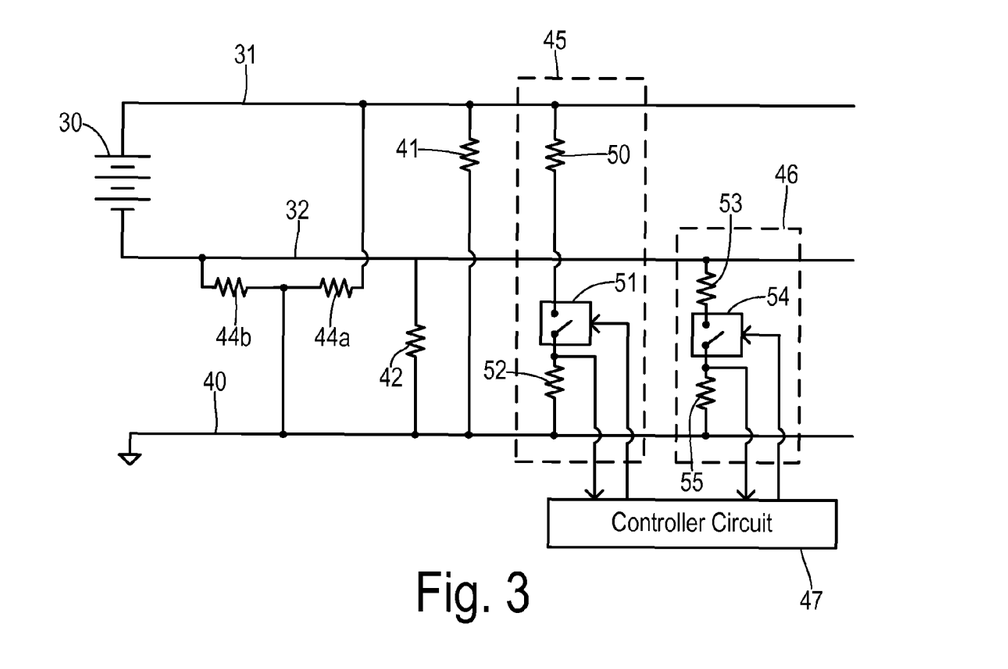
FIG. 3 is a schematic diagram showing test measurement circuits for characterizing bus leakage resistance.

FIG. 3 shows apparatus for detecting leakage resistance wherein a first detector circuit 45 is arranged between positive bus 31 and chassis ground 40 and a second detector circuit 46 is arranged between negative bus 32 and chassis ground 40. First detector circuit 45 includes a current-limiting resistor 50 in series with a sampling switch 51 and a current-sensing resistor 52. A controller circuit 47 is connected to switch 51 for selectively activating switch 51 so that a resulting first current flowing through detector circuit 45 creates a voltage across current-sensing resistor 52 proportional to the current passing through resistor 52 which is provided to controller circuit 47. Likewise, second detector circuit 46 includes a series connection of a current-limiting resistor 53, sampling switch 54, and current-sensing resistor 55 similarly connected to controller circuit 47. Controller circuit 47 may include a microcontroller such as in a battery energy controller module.

Figure 4:
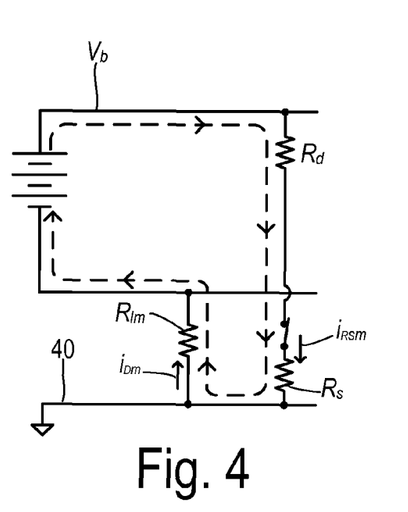
FIG. 4 is a schematic diagram showing an idealized current flow that is a basis of a prior art leakage resistance measurement.

In the leakage resistance detecting system based on conventional assumptions shown in FIG. 4, a current flowing through a current limiting resistor $R_d$ and current sensing resistor $R_s$ passes through leakage resistance $R_{lm}$, which denotes leakage resistance to the minus bus. Using a measured battery voltage $V_B$, the first measured current $I_{rsm}$, and known resistance values for $R_d$ and $R_s$, leakage resistance $R_{lm}$ is determined using the following formula:

$$R_{lm} = \frac{V_B}{I_{rsm}} - (R_d + R_S). \quad \text{(Eq. 1)}$$

Figure 5:
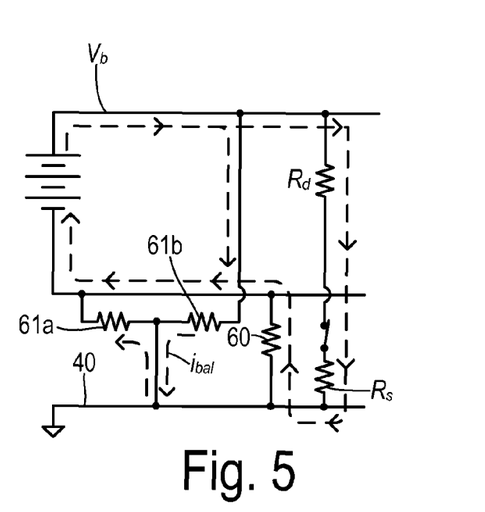
FIG. 5 is a schematic diagram showing an actual current flow during a test measurement which provides a basis for characterizing leakage resistance in the present invention.

As previously explained, however, the resulting value for the leakage resistance does not take into account the balanced resistance which instead creates the more complex equivalent circuit shown in FIG. 5. In this case, the sense current is not entirely due to the parallel negative bus leakage resistances R60 and R61a. In addition, a current flows through R61b from the positive bus, providing an opposing component of the balanced leakage current $i_{bal}$. Hence, the total sensed current under-represents the negative bus leakage current.

As seen from FIGS. 3 and 5, the total current through $R_{lm}$ (the leakage resistance associated with negative bus 32) includes balanced part from resistance 61 and a sense current $I_{RS}$ (i.e., including balanced and unbalanced portions of resistances 44, 41, and 42 of FIG. 3). When the sampling switch is closed, the current $I_{RS}$ is $$I_{RSM} = \frac{V_B R_{lp}}{R_C R_{lp} + R_{lm}(R_C + R_{lp})} \quad \text{(Eq. 2)}$$

where $R_{lp}$ is the leakage resistance 41 and balanced portion of 44 associated with positive bus 31 (FIG. 3), $R_{lm}$ is the leakage resistance 42 and balanced portion of 44 associated with negative bus 32 (FIG. 3), $I_{RSM}$ is the sense current $I_{RS}$ as shown in FIG. 4 when switch 51 (FIG. 3) is closed, and resistance $R_C$ is a combined resistance (e.g., a fixed 519 k-ohms) which includes the sum of the current-limiting resistance $R_D$ and the current-sensing resistance $R_S$. While the following text assumes the values of $R_D$ and $R_S$ in detector circuits 45 and 46 are equal to each other, for those familiar with the art these values may be changed while retaining the intent of this description. Thus, when the other sampling switch is closed, the current $I_{dp}$ can be determined using the formula:

$$I_{RSP} = \frac{V_B R_{lm}}{R_C R_{lm} + R_{lp}(R_C + R_{lm})}. \quad \text{(Eq. 3)}$$

Equations 2 and 3 are solved simultaneously for leakage resistances $R_{lp}$ and $R_{lm}$ as follows:

$$R_{lm} = \frac{V_B}{I_{RSM}} - R_C\left(1 + \frac{I_{RSP}}{I_{RSM}}\right) \quad \text{(Eq. 4)}$$

$$R_{lp} = \frac{V_B}{I_{RSP}} - R_C \left(1 + \frac{I_{RSM}}{I_{RSP}}\right) \quad \text{(Eq. 5)}$$

Thus, the ratios of the two measured currents provides respective correction factors to the conventional determination of the respective leakage resistances. The resulting values for the positive and negative leakage resistances, $R_{lp}$ and $R_{lm}$, based on the current ratios provide a more accurate assessment of the leakage resistances, which consequently enables more accurate determination of a corresponding electrical isolation.

In a preferred embodiment, a bus having a lower isolation is used to calculate an isolation value. Thus, the smaller of the calculated leakage resistances is selected and then divided by a predetermined voltage in order to calculate the isolation value. The predetermined voltage can be comprised of the measured voltage ($V_B$) of the DC source or a predetermined constant voltage (e.g., the nominal system voltage or a value specified by regulations). The isolation value can be calculated as follows:

$$\frac{\text{Min}(R_{lp}, R_{lm})}{V_B} \quad \text{(Eq. 6)}$$

The resulting isolation value is compared with an isolation threshold (e.g., 500 ohms/volt), and if it is less than the threshold then the invention signals that an atypical condition has been detected. The signaling may be comprised of informing a driver of the condition and/or automatically disconnecting the DC power source from the power buses (e.g., opening the contactor switches).

The calculated values for leakage resistances $R_{lp}$ and $R_{lm}$ can further be used to separate the balanced and unbalanced components of the resistances so that the components can be monitored over time in order to detect or predict certain potential failures in the electrical system. Examples of balanced leakage resistances that can change over time in a manner that identifies an impending fault include a) insulation breakdowns, and b) loss of effectiveness of a cooling-water deionizer in a fuel cell system. A plurality of leakage resistance measurements over time can be separated into balanced/unbalanced components and stored in a database. Both the magnitude and slope within the stored data (e.g., either the balanced or unbalanced components) is used to predict potential failures. Examples of unbalanced leakage resistances that may change over time include contact of battery terminals to chassis, wire contact to the chassis, and other forms of contact.

The calculated values for leakage resistances $R_{lp}$ and $R_{lm}$ can be separated as follows. The larger one of leakage resistances $R_{lp}$ and $R_{lm}$ will correspond to the balanced resistance, i.e., $R_{bal} = \max(R_{lp}, R_{lm})$. This is because, by definition, the value of $R_{bal}$ must be the same from chassis ground to both the positive and negative buses. An unbalance resistance exists in parallel with the value of $R_{bal}$, from either the positive or negative bus to ground. Since parallel resistances always result in a total resistance lower that each of the parallel resistances, the maximum of $R_{lp}$ and $R_{lm}$ corresponds to the balanced resistance.

The unbalanced resistance component can be calculated using $R_{lp}$ and $R_{lm}$ as follows:

$$R_{unbal} = \left| \frac{R_{lp} \cdot R_{lm}}{R_{lp} - R_{lm}} \right| \quad \text{(Eq. 7)}$$

Figure 6:
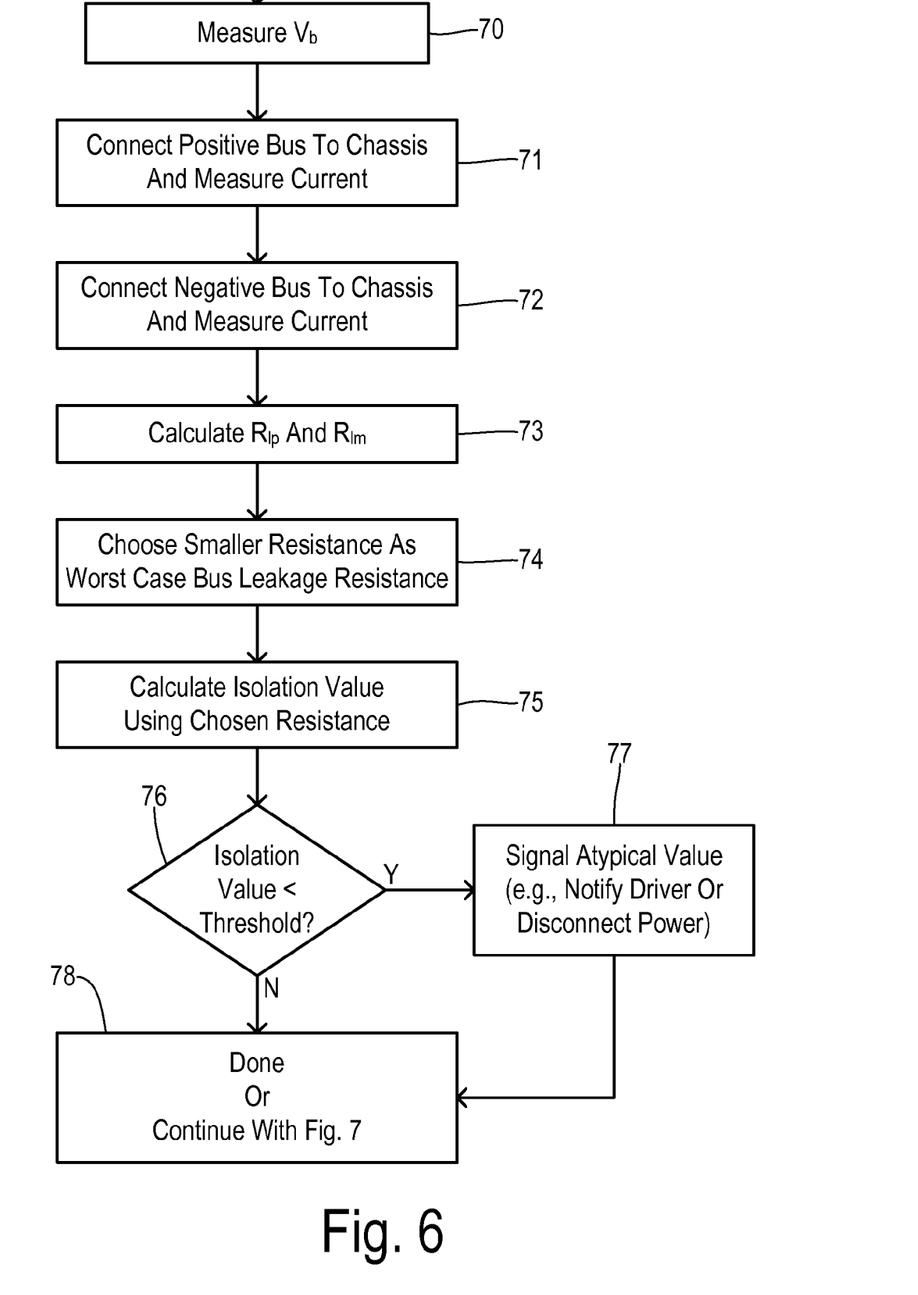
FIG. 6 is a flowchart of one embodiment of the invention wherein an electrical isolation is determined with an improved accuracy.
Figure 7:
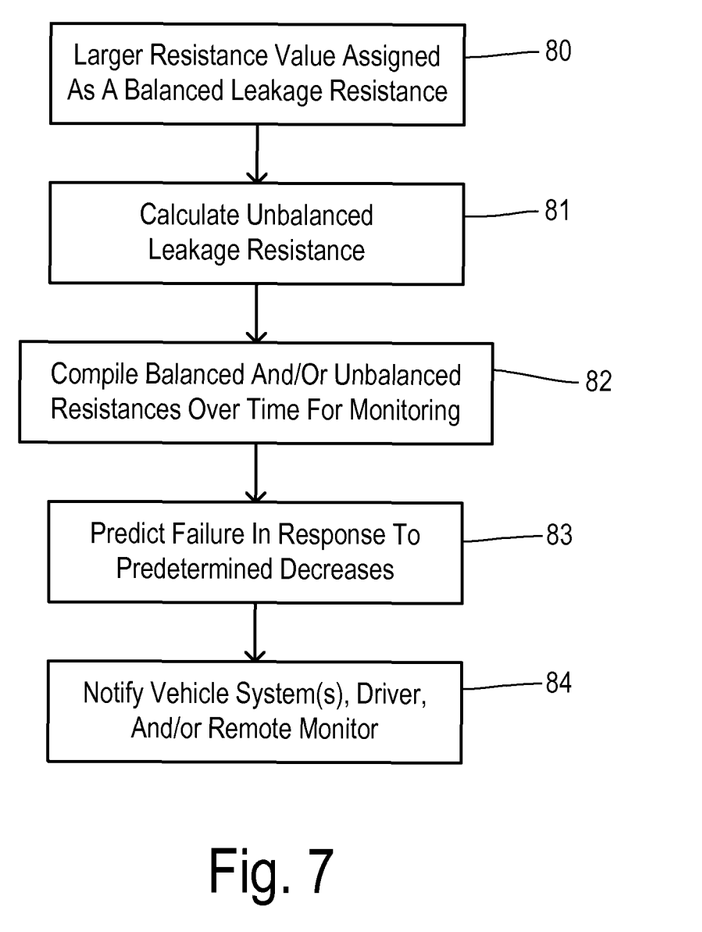
FIG. 7 is a flowchart of a further embodiment of the invention wherein balanced and/or unbalanced leakage resistance estimates provide improved vehicle diagnostics.

A method of the invention will be summarized in connection with the flowcharts of FIGS. 6 and 7. In step 70, the voltage $V_B$ of the DC power source is measured. In step 71, the positive bus is connected to the chassis ground and a resulting current is measured. The negative bus is then sequentially connected to chassis ground and a resulting current is measured in step 72. In step 73, leakage resistances $R_{LP}$ and $R_{LM}$ are calculated. The smaller of the two resistances is chosen in step 74 in order to identify a worst-case bus leakage resistance. In step 75, an isolation value is calculated using the chosen worst-case resistance.

In step 76, the isolation value is compared to an isolation threshold. If less ii) than the threshold, then the invention signals an atypical condition in step 77 (e.g., by notifying the driver or disconnecting power to the high-voltage buses). If the isolation value is not less than the threshold, then the method is completed at step 78. Optionally, an additional method can be executed wherein the balanced and unbalanced resistance values are determined in order to provide prediction of potential failures as shown in FIG. 7.

In FIG. 7, the larger resistance value is assigned as the balanced leakage resistance in step 80. In step 81, an unbalanced leakage resistance is calculated (e.g., using Equation 7). The calculated values for the balanced and/or unbalanced resistances are compiled over time in step 82. In step 83, predetermined potential failures can be predicted in response to predetermined decreases in the balanced or unbalanced resistances. More particularly, a potential failure can be predicted in response to a magnitude of a resistance value falling below a threshold or in response to data points accumulated over time exhibiting a negative slope that points toward an impending drop in the resistance value below a threshold. For example, a predetermined decrease in the balanced resistance component may correspond to a certain loss in effectiveness in deionizing the coolant water for a fuel-cell (leading to decreased power generation). Empirical testing may identify the magnitude or slope values of interest that can be used to detected a need for corrective action to repair or replace the deionizer. Whenever a potential failure is detected or predicted, step 84 is executed to provide notification to other vehicle systems (e.g., a controller for deactivating the main contactors between the DC source and the buses), the driver (e.g., via a malfunction indicator light), or a remote monitoring system (e.g., wirelessly to a manufacturer's database via an electronic cloud).

What is claimed is:

1. An electrified vehicle comprising:
a positive bus connectable to a positive output of a DC power source;
a negative bus connectable to a negative output of the DC power source;
a chassis ground distributed within the vehicle;
a first detector circuit comprising a first limiting resistance and a first sense resistance selectably connected between the positive bus and the chassis ground in order to sense a resulting first current flowing through a negative bus leakage resistance and a balanced leakage resistance;
a second detector circuit comprising a second limiting resistance and a second sense resistance selectably connected between the negative bus and the chassis ground in order to sense a resulting second current flowing through a positive bus leakage resistance and the balanced leakage resistance; and a control circuit identifying the positive and negative bus leakage resistances in response to respective ratios of the first and second currents.

2. The vehicle of claim 1 wherein the detector circuits include respective sampling switches closed by the control circuit.

3. The vehicle of claim 1 wherein the control circuit is configured to disconnect the positive and negative buses from the DC power source when an isolation value is less than a threshold, the isolation value being determined using a smaller one of the positive and negative bus leakage resistances.

4. The vehicle of claim 1 wherein the control circuit is configured to detect a fault condition when an isolation value is less than a threshold, the isolation value being determined using a smaller one of the positive and negative bus leakage resistances.

5. The vehicle of claim 1 wherein the positive bus leakage resistance is identified according a formula:

$$R_{lp} = \frac{V_b}{I_{RSP}} - R_C\left(1 + \frac{I_{RSM}}{I_{RSP}}\right)$$

where $R_{lp}$ is the positive bus leakage resistance, $V_b$ is a voltage from the DC power source, $I_{RSP}$ is the second current, $I_{RSM}$ is the first current, and $R_C$ is the combined sense circuit resistance.

6. The vehicle of claim 1 wherein the negative bus leakage resistance is identified according a formula:

$$R_{lm} = \frac{V_b}{I_{RSM}} - R_C\left(1 + \frac{I_{RSP}}{I_{RSM}}\right)$$

where $R_{lm}$ is the negative bus leakage resistance, $V_b$ is a voltage from the DC power source, $I_{RSM}$ is the first current, $I_{RSP}$ is the second current, and $R_C$ is the combined sense circuit resistance.

7. The vehicle of claim 1 wherein the control circuit identifies a balanced leakage resistance as a higher one of the positive and negative bus leakage resistances, and wherein the control circuit monitors changes over time of the balanced leakage resistance to identify a potential malfunction of the vehicle.

8. The vehicle of claim 1 wherein the control circuit identifies an unbalanced resistance according to a formula:

$$R_{unbal} = \left|\frac{R_{lp} \cdot R_{lm}}{R_{lp} - R_{lm}}\right|$$

where $R_{lp}$ and $R_{lm}$ are the positive and negative bus leakage resistances, respectively, and wherein the control circuit monitors changes over time of the unbalanced resistance to identify a potential malfunction of the vehicle.

9. A method of detecting bus isolation for an electrified vehicle, the vehicle having a DC power source connectable to a positive bus and a negative bus and a chassis ground distributed within the vehicle, the method comprising the steps of:

connecting a first fixed resistance between the positive bus and chassis ground;

sensing a resulting first current flowing through a negative bus leakage resistance and a balanced leakage resistance;

connecting a second fixed resistance between the negative bus and chassis ground;

sensing a resulting second current flowing through a positive bus leakage resistance and a balanced leakage resistance;

estimating the positive and negative bus leakage resistances in response to respective ratios of the first and second currents;

comparing an isolation value to a threshold, wherein the isolation value is responsive to a voltage of the DC power source and a smaller one of the positive and negative bus leakage resistances; and signaling an atypical isolation when the isolation value is less than the threshold.

10. The method of claim 9 wherein the signaling of an atypical isolation includes disconnecting the DC power source from the positive and negative buses.

11. The method of claim 9 further comprising the step of measuring the voltage of the DC power source, wherein the measured voltage is used in determining the isolation value.

12. The method of claim 9 wherein the voltage used in determining the isolation value is comprised of a predetermined constant.

13. The method of claim 9 wherein the positive bus leakage resistance is estimated according a formula:

$$R_{lp} = \frac{V_b}{I_{RSP}} - R_C\left(1 + \frac{I_{RSM}}{I_{RSP}}\right)$$

where $R_{lp}$ is the positive bus leakage resistance, $V_b$ is a measured voltage from the DC power source, $I_{RSP}$ is the second current, $I_{RS}$ is the first current, and $R_C$ is the combined sense circuit resistance.

14. The method of claim 9 wherein the negative bus leakage resistance is estimated according a formula:

$$R_{lm} = \frac{V_b}{I_{RSM}} - R_C\left(1 + \frac{I_{RSP}}{I_{RSM}}\right)$$

where $R_{lm}$ is the negative bus leakage resistance, $V_b$ is a measured voltage from the DC power source, $I_{RSM}$ is the first current, $I_{RSP}$ is the second current, and $R_C$ is the combined sense circuit resistance.

15. An electrified vehicle comprising:

a positive bus connectable to a positive output of a DC power source;

a negative bus connectable to a negative output of the DC power source;

a chassis ground distributed within the vehicle;

a first detector circuit comprising a first limiting resistance and a first sense resistance selectably connected between the positive bus and the chassis ground in order to sense a resulting first current flowing through a negative bus leakage resistance and a balanced leakage resistance;

a second detector circuit comprising a second limiting resistance and a second sense resistance selectably connected between the negative bus and the chassis ground in order to sense a resulting second current flowing through a positive bus leakage resistance and the balanced leakage resistance; and a control circuit identifying the positive and negative bus leakage resistances in response to respective ratios of the first and second currents, wherein the control circuit identifies a balanced resistance as a higher one of the positive and negative bus leakage resistances, and wherein the control circuit monitors changes over time of the balanced resistance to identify a potential malfunction of the vehicle;

wherein the DC power source is a fuel cell with a deionizer, and wherein the monitoring of changes in the balanced resistance is comprised of comparing the balanced resistance with a threshold to detect a malfunction of the deionizer.

* * * * *